United States Patent [19]
Kub et al.

[11] Patent Number: 5,781,063
[45] Date of Patent: Jul. 14, 1998

[54] CONTINUOUS-TIME ADAPTIVE LEARNING CIRCUIT

[75] Inventors: Francis J. Kub, Arnold; Eric W. Justh, Rockville, both of Md.

[73] Assignee: The United States of America as represented by the Secretary of the Navy, Washington, D.C.

[21] Appl. No.: 554,160

[22] Filed: Nov. 6, 1995

[51] Int. Cl.$^6$ .................... H03K 5/00; G06F 7/38
[52] U.S. Cl. .................... 327/552; 327/341; 327/231; 333/166; 364/724.19
[58] Field of Search .................... 322/336, 334, 322/552, 554, 555, 556, 557, 558, 559, 560, 341, 355; 333/165, 166; 364/724.19; 327/231

[56] References Cited

U.S. PATENT DOCUMENTS

| | | |
|---|---|---|
| 4,145,747 | 3/1979 | Sakai et al. .................... 364/724 |
| 4,400,637 | 8/1983 | Klar et al. .................... 327/336 |
| 4,633,223 | 12/1986 | Senderowicz .................... 340/347 |

*Primary Examiner*—Timothy P. Callahan
*Assistant Examiner*—Dinh Le
*Attorney, Agent, or Firm*—Thomas E. McDonnell; Edward F. Miles

[57] ABSTRACT

An integrator-multiplier-integrator circuit scheme usable in transverse filters, a transverse filter employing such a circuit, and a method for using each. The multiplier-integrator-multiplier has a capacitatively loaded integrating amplifier fed by a transistor. The current through the transistor, and hence the time it takes to charge the integrating capacitor, depends largely on the bias of the transistor, not the size of the capacitor, permitting one to set and control integration time by setting the transistor's parameters, and controlling its bias, effectively controlling integration time by us of only one semiconductor device. An additional circuit for auto-zeroing (i.e. canceling quiescent offset) increases adaptivity of the circuit. Preferably the phase of inputs to the first multiplier is made selectably variable to minimize phase difference at the multiplier, thus increasing circuit stability.

15 Claims, 3 Drawing Sheets

5,781,063

CONTINUOUS-TIME ADAPTIVE LEARNING CIRCUIT

BACKGROUND OF THE INVENTION

Adaptive filter circuits which employ the least mean square learning algorithm have widespread applications, which are continually growing in number. These adaptive filters employ a number of circuit legs which sequentially multiply a time delayed reference input signal with an error signal, integrate the product, and multiply the integrated product with the reference input delayed signal. The longer the time constant of the integrator circuit, the more desirable is the integrator because it can effectively integrate over longer time periods. Long integrator time constants are useful for adaptive filter circuits because they increase the range of applications for which the adaptive filter can be used. For example, the smallest notch filter bandwidth that can be achieved by an adaptive filter is often determined by the length of the time constant. Also, minimum filter adaptive filter operation frequency is several orders of magnitude higher than the corner frequency of the integrator, so that a large time constant extends the allowable frequency of operation of the adaptive filter. Conventional integrator circuits, such as simple RC networks cannot produce sufficiently long time constants, generally equal to RC, for many applications because the physical size of the capacitors would necessarily be too large for integrated semiconductor chips; and it is difficult to fabricate high value resistors with conventional integrated circuit technology.

Additionally, many integrator circuits when used in integrated circuits have unacceptably poor high frequency response for many adaptive learning applications, further limiting the usefulness of these circuits. For example, the frequency of operation of switched capacitor integrators is limited by the need for high amplifier bandwidth to provide sufficient settling accuracy for sampled-data signal processing.

One approach is reflected in U.S. patent application Ser. No. 07/984,111 by Kub and Justh Kub et al. (attorney docket no. 74,832), currently pending. Kub et al. disclose an integrator-multiplier-integrator in which the integrator is a transconductance-C circuit, and which the integration time is controlled largely by FET parameters. It is, however, desirable in this art to extend the level of adaptivity of such circuits that can be achieved by the adaptive filter circuit. The level of adaptivity that can be achieved by the transconductance-C integrator approach is limited by random offset voltages and limited gain.

SUMMARY OF THE INVENTION

Accordingly, an object of the invention is permit fabrication of integrator circuits having a large time constant without use of high value resistors (>1 MΩ).

Another object is to provide continuous-time (i.e. not sampled data) multiplier-integrator-multiplier circuit legs having good high frequency performance.

Another object is to do the foregoing in a manner which will permit realization of such circuit legs in monolithic semiconductor chips, using state of the art semiconductor fabrication techniques.

Another object is to achieve high levels of adaptivity.

Another object is to increase the bandwidth of operation of the adaptive filter circuit.

Aspects of the invention are touched on by Kub and Justh, High Frequency Analog Circuits Implementing Tapped Delay Lines and the LMS Algorithm, which appears in Proceedings of the 1994 Adaptive Antenna Systems Symposium (Nov. 7–8, 1994, hosted by the Long Island Section of the Institute of Electrical and Electronics Engineers), which is incorporated herein by reference. More broadly, these and other objects are secured in accordance with the various features and advantages of the invention. In accordance with one feature, a multiplier-integrator-multiplier has a capacitatively loaded integrating amplifier fed by a transistor. The current through the transistor, and hence the time it takes to charge the integrating capacitor, depends largely on the bias at the gate of the transistor, not the size of the capacitor. In this manner, one can set and control integrating time by setting the transistor's parameters, and controlling its bias, thus controlling integration time by controlling one semiconductor device. In accordance with another feature, a semiconductor integrator-multiplier-multiplier has an additional circuit for auto-zeroing (canceling quiescent offset), thus increasing adaptivity of the circuit. In accordance with another feature, the phase of inputs to the first multiplier is selectably varied to minimize phase difference, between the multiplier inputs, thus increasing circuit stability, bandwidth, and adaptivity.

These and other objects, features, and advantages of the invention are further understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

DETAILED DESCRIPTION

Figure 1:
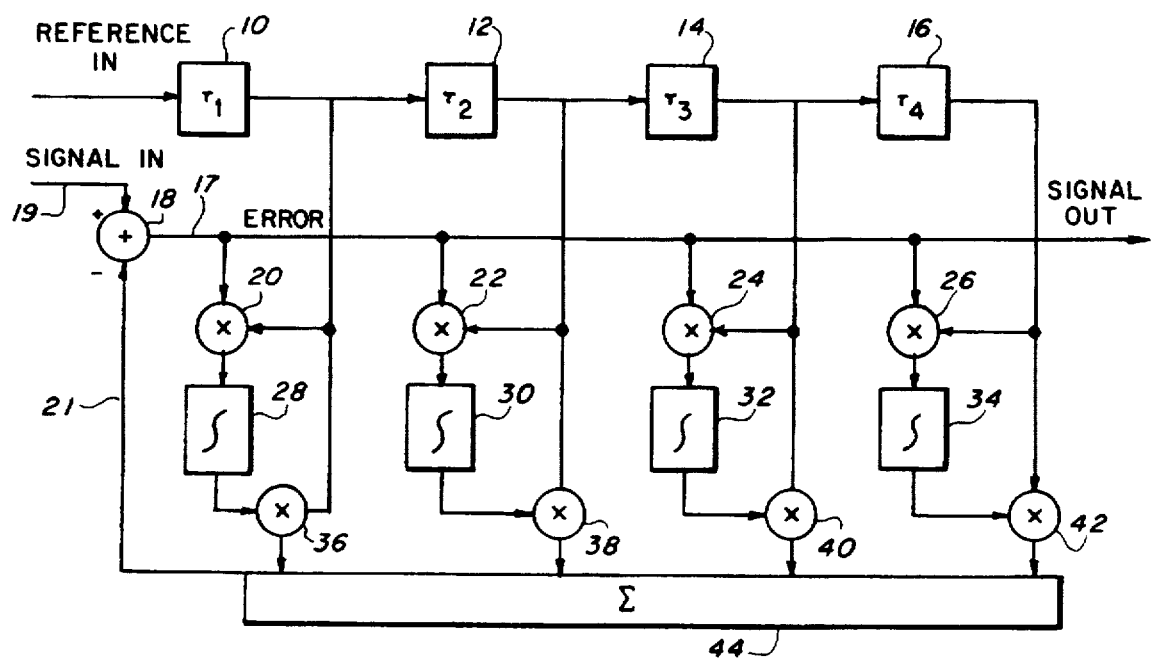
FIG. 1 is a circuit schematic showing a prior art transverse filter, having four multiplier-integrator-multiplier legs.

With reference to the drawing figures, wherein like references indicate like parts throughout the several views, FIG. 1 shows a prior art transverse filter having four cancellation legs. The circuit receives an input signal 19, and a sum signal 21 at signal adder 18, and a reference signal 11, 13 at delay element 10. (Why each signal is denominated by two references will become apparent in the discussion of FIGS. 2 ff.) The input and reference signals could, for example, be a radar echo combined with jammer noise, a jammer noise, respectively, such as one would get with conventional military radar systems using a mainbeam antenna for the main signal, and a spatially distant auxiliary antenna for the reference signal.

The main signal 19 subtracted from the sum signal 21 via summer 18 and is fed in parallel to a first multiplier 20, 22, 24, 26 in each respective leg of the filter. The reference signal is also fed to these multipliers, but cumulatively shifted in phase at each leg by delays 10, 12, 14, and 16. Each leg outputs the product of the main, and time delayed reference, signals to respective integrators 28, 30, 32, 34. Each leg contains a second multiplier, 36, 38, 40, 42, respectively, which multiply integrator output with the time delayed reference input into the leg's first and second multipliers. (E.g., multiplier 36 multiplies the output of integrator 28 with the reference signal delayed by an amount $\tau_1$ by delay 10; multiplier 40 multiplies the output of integrator 32 with the reference signal delayed output from delay 14, and hence delayed by $\tau_1+\tau_2+\tau_3$, etc.) Summer 44 receives and adds the outputs of each second multiplier 36, 38 40, 42, and directs this sum to subtractor 18, where the sum is subtracted from the main input signal, yielding an error signal 15, 17, which is also a corrected main signal 45.

Such circuit are well known as an interference canceler. Generally speaking, each pair of cancellation legs (20, 28, 36 being one leg, and 22, 30, 38 being another such leg) permits cancellation of one unwanted frequency or interference in the main signal, provided one has some knowledge of what those frequencies or interferences might be, and hence judiciously selects the values of $\tau$ accordingly. If so, the output of each integrator will converge to a weight value which causes optimal cancellation of unwanted frequencies at the output of 18, which is the corrected main signal 45 (i.e. optimally given the values of $\tau$, which may or may not themselves be optimal for the specific frequencies one may wish to cancel).

Figure 2:
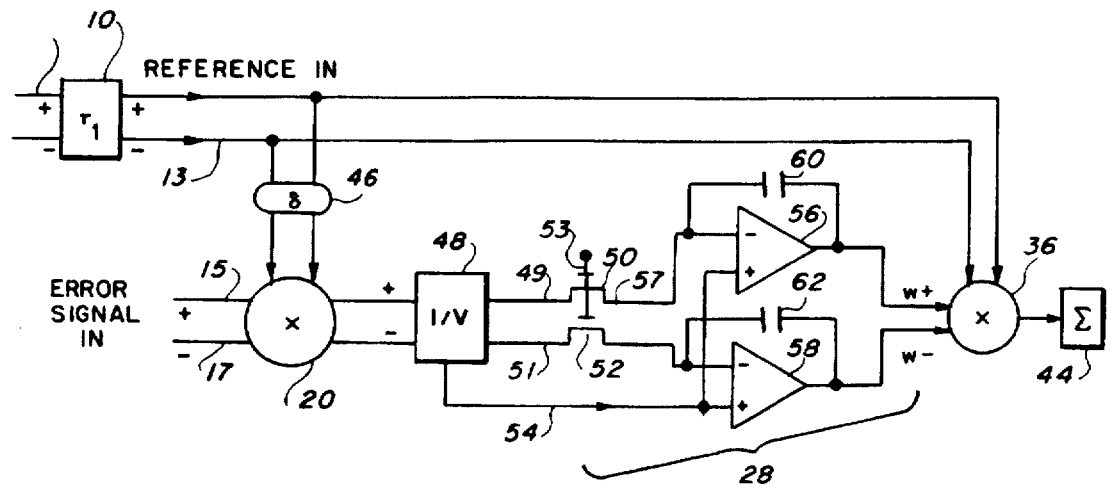
FIG. 2 is a circuit schematic showing a multiplier-integrator-multiplier circuit useable, e.g., in the filter of FIG. 1.

FIG. 2 shows a circuit leg, of the type above described in FIG. 1, according to the invention. (For simplicity, part numbers will be that of the first leg shown in FIG. 1, i.e. 20, 28, and 36.) The error signal arrives via lines 15, 17, which are marked respectively "+" and "−", i.e. to indicate that the signals on lines 15 and 17 are the inverse of each other (180° apart). Similarly, the reference signal appears at 11, 13 similarly the inverse of one another, and are input to multiplier 20 with an additional time delay, or phase shift, $\tau_1$ with respect to the main signal. Providing the main and reference signals as separate "plus" and "minus" lines permits use of four-quadrant multipliers (e.g. Gilbert multipliers) at 20 and 36, which experience shows provides best results for cancelling harmonics, and is most compatible with C-MOS (n.b. FET) technology. The lines carrying the reference signal to the first multiplier 20 may also have an additional phase shift $\delta$ per time delay element 46. The reference is also applied to the second multiplier 36, for reasons discussed below.

The two quadrant current output (i.e. "plus" and "minus" outputs) of multiplier 20 is input to current to voltage converter 48. Four quadrant C-MOS multipliers such as the Gilbert multiplier produce an output signal in current form. A current signal could, in principle, be input directly into an integrator such as 28, but this would result in a large integrated current per magnitude of input signal, much of which would correspond only to quiescent current flowing in multiplier 20. This would require larger integration capacitors, a shorter integration time, and a less accurate integrated signal. It is thus preferred that the inputs 49, 51 to integrator 28 be voltages, rather than currents. This current to voltage converter 48 does the required current to voltage translation.

The "plus" and "minus" outputs of converter 48 go respectively to FET's 50, 52, and thereafter to the inverting inputs of difference amplifiers 56, 58. FET's 50 and 52 are biased (53) to pass the same amount of current, and hence constitute the same absolute value of current between source and drain, for the same absolute value of input voltage signal at 49, 51. In this manner, FET's 50, 52 produced a balanced "plus" and "minus" two-quadrant input to amplifiers 56, 58. The biases to the non-inverting inputs to amplifiers 56, 58 can be set in any manner consistent with their operating parameters; however, experience with C-MOS technology indicates that the setpoint, or quiescent operating point, of current to voltage converter 48 is about the same as one would need for C-MOS operational amplifiers, and thus amplifiers 56, 58 are biased at converter 48's setpoint via line 54.

Amplifiers 56, 58 have corresponding capacitors 60, 62 in the configuration of a conventional integrator. Thus the two-quadrant signals from lines 49, 51 via FET's 50, 52 are integrated, and input to four quadrant multiplier 36, where the integrated signal is multiplied with the delayed (by $\tau_1$) reference signal 11, 13 and output to summer 44, as described above. Thus the circuitry of FIG. 2 constitutes a multiplier-integrator-multiplier circuit of the kind used in the adaptive filter of FIG. 1. Notably, however, The rate at which capacitors 60 and 62 charge depends on the amount of current which FET's 50, 52 permit to pass, which in turn depends on their bias 53. Thus the time constant of the integrators depends largely on the gain parameters of FET's 50, 52, not on bulk-size. Thus the circuit according to FIG. 2 can be made smaller for the same integration times, and thus more such circuits could be put on one chip.

Figure 3:
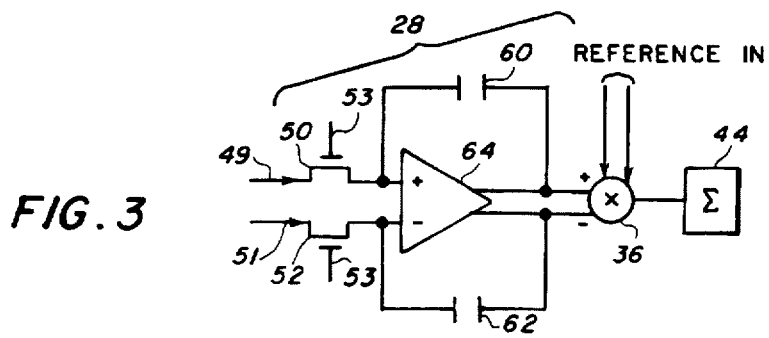
FIG. 3 is a circuit schematic showing an alternative integrator scheme.

FIG. 3 shows an alternative to the integrator of FIG. 2. Instead of two difference amplifiers biased to the same setpoint, amplifier 64 is conventional balanced amplifier with common mode feedback, i.e. the amplifier's outputs are set to a well-defined operating point by the common mode feedback circuitry. This dispenses with the need to provide a separate setpoint bias to integrator 64, as was done at 54 in FIG. 2.

Figure 4:
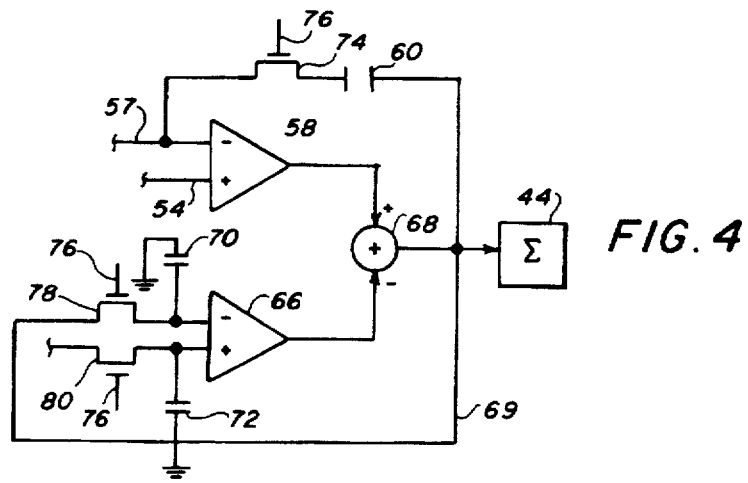
FIG. 4 is a circuit schematic showing an auto-zeroing circuit for integrators, such as are shown in FIGS. 2–3.

FIG. 4 shows additional circuitry for autozeroing a circuit such as that in FIG. 2, i.e. correcting for non-zero outputs resulting from zero inputs at 11, 13, 15, 17 (e.g. cumulative quiescent offsets from the various devices in the circuit of FIG. 2.). Amplifier 58 has associated with it an additional amplifier 66, whose output is subtracted from that of amplifier 58 at summer 68. Switches 78, 80 permit selective isolation of the inputs to amplifier 66, and switch 74 permits selective isolation integration of capacitor 60. The inputs to amplifier 66 have parallel capacitors 70, 72. Associated with capacitor 60 is a switch, preferably a FET switch 74, which can open to isolate capacitor 60 from the circuit. The switches are controllably biased to open or close simultaneously by bias 76, and preferably FET's to permit integral fabrication of all circuit elements on one chip.

In operation, all circuit inputs of the first multiplier 20 are disconnected from the error signals 15, 17, and the reference signals 11, 13, and connected in common to a bias voltage by transistor switch arrangements (not shown), switches 80, 78 closed, and switch 74 opened. Any residual non-zero output from amplifier 58 is fed back via summer 68 (which can include a gain element, not explicitly shown) via line 69 and switch 78 to amplifier 66, which outputs a signal to summer 68 that subtracts from the output of amplifier 58. This reduces the output from 68 fed back to amplifier, and, similar to a servo-controller, the output of 66 eventually stabilizes at the magnitude necessary to balance the output of 58. The corresponding input signal (via switch 78) to amplifier 66 which causes this balance charges capacitor 70, thus recording this input on capacitor 70. (Switch 80 and capacitor 72 operate in the same manner to record the bias voltage on amplifier 66 presence when this balance occurred.) Switches 78, 80 are then opened to prevent further charging or discharging of capacitors 70, 72, and switch 74 is closed to permit normal operation of the circuit responsive to input signals. In the foregoing, only integrator 58, 60 is mentioned. It is understood, however, that in a circuit such as in FIG. 2 which has two such integrators to produce a two-quadrant output will need an auto-zeroing circuit of this kind for each integrator.

Figure 5:
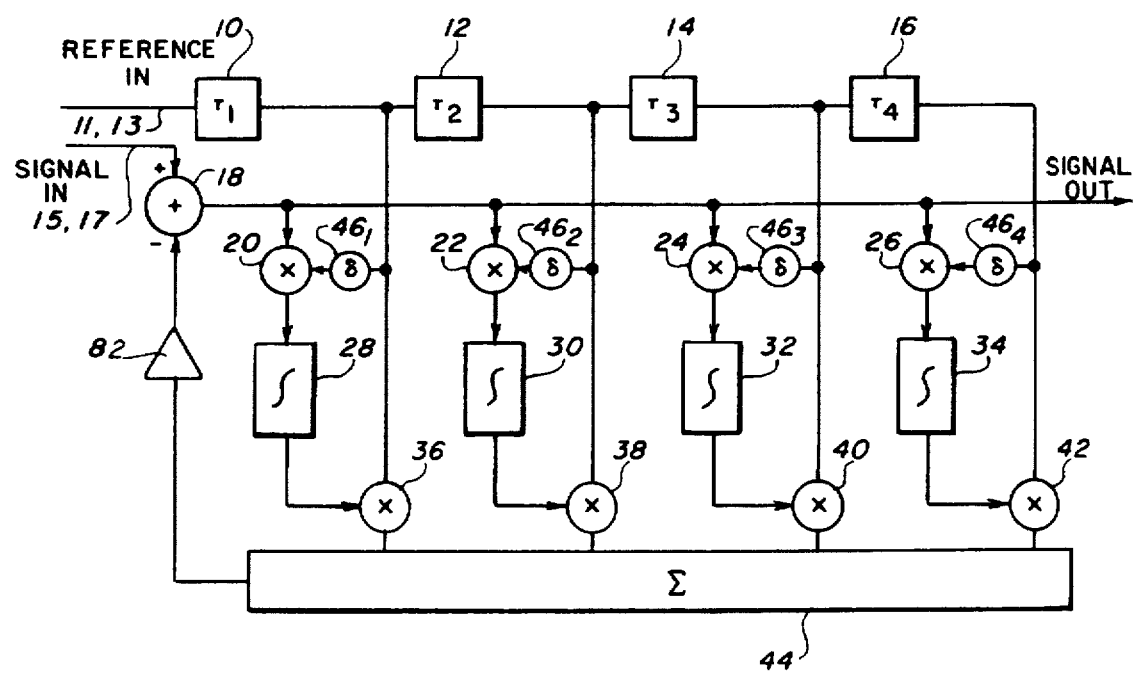
FIG. 5 is a circuit schematic showing similar to that of FIG. 1, with additional phase-control circuitry.

FIG. 5 shows a general transverse filter like that of FIG. 1, with the addition to each leg a corresponding delay $46_1$, $46_2$, $46_3$, and $46_4$, and complex amplifier 82. If the two inputs to the first multiplier (20, 22, 24, 26 for the four legs, respectively) of any of the circuit legs are significantly different in time delay (phase shift), filter performance can degrade sharply. (Experience shows that if the phase exceeds 45°, the filter can oscillate.) Each delay 46 is preferably programmable, and set to phase match the inputs to multipliers 20, 22, 24, 26, in any known manner, e.g. by multiple delay stages with integral switch-in and switch-out circuitry.

Amplifier 82 provides a complex gain which boosts the amplitude of the signal output from summer 44 to match the amplitude of the main signal input to member 18, and adds undesired phase shift to the sum signal 21. Phase shift element 46 is designed to compensate for the phase shift of amplifier 82, and any other phase shift in the feedback path. In practice, virtually all of this phase shift occurs between the output of summer 44 and the input of summer 18, so placement of amplifier 82 in this line is not only effective, but preferred.

The invention has been described in what is considered to be the most practical and preferred embodiments. It is recognized, however, that obvious modifications to these embodiments may occur to those with skill in this art. Accordingly, the scope of the invention is to be discerned from reference to the appended claims, wherein:

We claim:

1. A multiplier-integrator-multiplier circuit comprising:
   a first multiplier;
   an integrator adapted to receive the output of said multiplier; and
   a second multiplier adapted to receives the output of said integrator;
   wherein said integrator comprises:
      a difference amplifier;
      an integrating capacitor in parallel with said difference amplifier; and
      a transistor, the output of said transistor disposed to constitute the input of said difference amplifier;
   wherein said circuit further comprises an auto-zero circuit, said auto-zero circuit comprising:
      means for isolating said capacitor and isolating the input to said difference amplifier; and
      a further capacitor disposed in parallel with the output of said input of said difference amplifier, and said output of said integrator.

2. A multiplier-integrator-multiplier circuit comprising:
   a first multiplier;
   an integrator adapted to receive the output of said multiplier; and
   a second multiplier adapted to receive the output of said integrator;
   wherein said integrator comprises:
      a difference amplifier;
      an integrating capacitor in parallel with said difference amplifier; and
      a transistor, the output of said transistor disposed to constitute the input of said difference amplifier;
   wherein:
      said difference amplifier is a pair of difference amplifiers disposed to cause said integrator to be a two-quadrant integrator; and
      said transistor is a pair of transistors, one each of said pair of transistors disposed so that the output of said one each of said pair of transistors is the input of a respective one of said pair of difference amplifiers;
   wherein said circuit further comprises an additional difference amplifier for auto-zeroing the output of at least one of said pair of difference amplifiers, wherein:
      one input of said additional difference amplifier is disposed to receive: a preselectable calibration signal, and said output of said circuit;
      the other input of said additional difference amplifier is disposed to receive the output of said circuit;
      wherein said circuit further comprises a summing junction disposed to receive the output of said at least one of said difference amplifiers and the output of said additional difference amplifier.

3. The circuit of claim 2, wherein each said input of said additional difference amplifier has an associated capacitor, each said capacitor being disposed effective to hold a charge, responsive to said one and said other input of said additional difference amplifier, corresponding to auto-zero setpoint for said circuit.

4. A multiplier-integrator-multiplier circuit comprising:
   a first multiplier;
   an integrator adapted to receive the output of said multiplier; and
   a second multiplier adapted to receive the output of said integrator;
   wherein said integrator comprises:
      a difference amplifier;
      an integrating capacitor in parallel with said difference amplifier; and
      a transistor, the output of said transistor disposed to constitute the input of said difference amplifier;
   wherein said difference amplifier is a pair of difference amplifiers disposed to cause said integrator to be a two-quadrant integrator; and
   said transistor is a pair of transistors, one each of said pair of transistors disposed so that the output of said one each of said pair of transistors is the input of a respective one of said pair of difference amplifiers;
   wherein said pair of difference amplifiers is a unitary balanced amplifier with common mode feedback, and said transistor is a pair of transistors, one each of said pair of transistors disposed so that the output of said one each of said pair of transistors is the input of a respective input of said balanced amplifier.

5. A multiplier-integrator-multiplier circuit comprising:
   a first multiplier;
   an integrator adapted to receive the output of said multiplier; and
   a second multiplier adapted to receive the output of said integrator;
   wherein said integrator comprises:
      a difference amplifier;
      an integrating capacitor in parallel with said difference amplifier; and
      a transistor, the output of said transistor disposed to constitute the input of said difference amplifier;
   wherein said circuit further comprises an additional difference amplifier for auto-zeroing the output of said circuit, wherein:

one input of said additional difference amplifier is disposed to receive: a preselectable input signal, and said output of said circuit;

the other input of said additional difference amplifier is disposed to receive: the output of said circuit;

wherein said circuit further comprises a summing junction disposed to receive the output of said integrator and said additional difference amplifier.

6. The circuit of claim 5, wherein each said input of said additional difference amplifier has an associated capacitor, each said associated capacitor being disposed effective to hold a charge, responsive to the inputs to each corresponding said input to said additional difference amplifier, corresponding to auto-zero setpoint for said circuit.

7. A multiplier-integrator-multiplier circuit comprising:

a first multiplier;

an integrator adapted to receive the output of said multiplier; and a second multiplier adapted to receive the output of said integrator;

wherein said integrator comprises:

a difference amplifier;

an integrating capacitor in parallel with said difference amplifier; and a transistor, the output of said transistor disposed to constitute the input of said difference amplifier; and wherein the input of said first multiplier comprises a phase shifter effective to cause a preselected phase at said input.

8. A transverse filter comprising:

a plurality of multiplier-integrator-multiplier circuit legs effective to produce a corresponding plurality of output signals;

means for inputing a main signal to said filter;

means for inputing an error signal to said filter;

means for summing said corresponding plurality of outputs to form a feedback signal;

subtractor means for differencing said feedback signal and said main signal;

an adjustable phase shifter effective to selectable reduce the phase difference between said feedback signal and said main signal;

wherein at least one of said circuit legs comprises:

a first multiplier;

an integrator adapted to receive the output of said multiplier; and a second multiplier adapted to receive the output of said integrator;

wherein said integrator comprises:

a difference amplifier;

an integrating capacitor in parallel with said difference amplifier; and a transistor, the output of said transistor disposed to constitute the input of said difference amplifier.

9. The circuit of claim 8, wherein the input to said transistor comprises a current to voltage converter.

10. The circuit of claim 9, wherein the input of said first multiplier comprises a phase shifter effective to cause a preselected phase at said input.

11. A method of filtering a signal using a transverse filter, said filter comprising a multiplier-integrator-multiplier circuit, said circuit comprising a first multiplier, an integrator, a second multiplier, and a transistor, said integrator comprising a difference amplifier and an integrating capacitor in parallel with said difference amplifier, the output of said transistor being disposed to constitute the input of said difference amplifier, wherein said method comprises:

causing said first multiplier to receive an input;

causing said integrator to receive the output of said first multiplier;

causing said second multiplier to receive the output of said integrator;

setting the bias of said transistor effective to selectably set the time constant of said integrator;

wherein said difference amplifier is a pair of difference amplifiers disposed to cause said integrator to be a two-quadrant integrator; and said transistor is a pair of transistors;

wherein said method further comprises disposing said pair of transistors so that the output of each of said pair of transistors is the input of the respective other of said pair of difference amplifiers;

wherein said circuit further comprises an additional difference amplifier for auto-zeroing the output of at least one of said pair of difference amplifiers, and wherein:

one input of said additional difference amplifier is disposed to receive: a preselectable calibration signal, and said output of said circuit; and the other input of said additional difference amplifier is disposed to receive the output of said circuit;

wherein said method comprises summing the output of said at least one of said difference amplifiers and the output of said additional difference amplifier.

12. The method of claim 11, wherein each said input of said additional difference amplifier has an associated capacitor, each said capacitor being disposed effective to hold a charge, corresponding to auto-zero setpoint for said circuit, said method further comprising selectably charging each said capacitor to fix said setpoint.

13. A method of filtering a signal using a transverse filter, said filter comprising a multiplier-integrator-multiplier circuit, said circuit comprising a first multiplier, an integrator, a second multiplier, and a transistor, said integrator comprising a difference amplifier and an integrating capacitor in parallel with said difference amplifier, the output of said transistor being disposed to constitute the input of said difference amplifier, wherein said method comprises:

causing said first multiplier to receive an input;

causing said integrator to receive the output of said first multiplier;

causing said second multiplier to receive the output of said integrator;

setting the bias of said transistor effective to selectable set the time constant of said integrator;

wherein said difference amplifier is a pair of difference amplifiers disposed to cause said integrator to be a two-quadrant integrator; and said transistor is a pair of transistors;

wherein said method further comprises disposing said pair of transistors so that the output of each of said pair of transistors is the input of the respective other of said pair of difference amplifiers;

wherein said pair of difference amplifiers is a unitary balanced amplifier with common mode feedback, and said transistor is a pair of transistors, and said method further comprises causing one each of said pair of transistors to be disposed so that the output of said one each of said pair of transistors is the input of a respective input of said balanced amplifier.

14. A method of filtering a signal using a transverse filter, said filter comprising a multiplier-integrator-multiplier circuit, said circuit comprising a first multiplier, an integrator, a second multiplier, and a transistor, said integrator comprising a difference amplifier and an integrating capacitor in parallel with said difference amplifier, the output of said transistor being disposed to constitute the input of said difference amplifier, wherein said method comprises:

causing said first multiplier to receive an input;

causing said integrator to receive the output of said first multiplier;

causing said second multiplier to receive the output of said integrator;

setting the bias of said transistor effective to selectably set the time constant of said integrator;

wherein said circuit further comprises an additional difference amplifier for auto-zeroing the output of said circuit, wherein:

one input of said additional difference amplifier is disposed to receive a preselectable input signal, and said output of said circuit;

the other input of said additional difference amplifier is disposed to receive: the output of said circuit;

wherein said method comprises summing the output of said integrator and said additional difference amplifier.

15. The method of claim 14, wherein each said input of said additional difference amplifier has an associated capacitor, each said associated capacitor being disposed effective to hold a charge, responsive to the inputs to each corresponding said input to said additional difference amplifier, corresponding to auto-zero setpoint for said circuit, and said method further comprises charging said capacitors to selectably determine said setpoint.

* * * * *